(12) United States Patent
Drury

(10) Patent No.: US 7,955,693 B2
(45) Date of Patent: Jun. 7, 2011

(54) FOAM COMPOSITION ROLLER BRUSH WITH EMBEDDED MANDREL

(75) Inventor: Thomas J. Drury, Willimantic, CT (US)

(73) Assignee: Tolland Development Company, LLC, Willimantic, CT (US)

( * ) Notice: Subject to any disclaimer, the term of this patent is extended or adjusted under 35 U.S.C. 154(b) by 752 days.

(21) Appl. No.: 12/071,017

(22) Filed: Feb. 14, 2008

(65) Prior Publication Data

US 2008/0141475 A1 Jun. 19, 2008

Related U.S. Application Data

(63) Continuation-in-part of application No. 10/748,302, filed on Dec. 31, 2003, now abandoned, which is a continuation of application No. 09/838,138, filed on Apr. 20, 2001, now abandoned.

(51) Int. Cl.
*B32B 3/26* (2006.01)
*B32B 3/00* (2006.01)
*A47L 1/02* (2006.01)
*E01C 23/20* (2006.01)
*A47K 7/02* (2006.01)

(52) U.S. Cl. ............... 428/304.4; 428/315.5; 428/315.7; 15/97.1; 15/103.5; 15/244.1; 15/244.4

(58) Field of Classification Search ............... 428/304.4, 428/315.5, 315.7; 15/97.1, 103.5, 244.1, 15/244.4
See application file for complete search history.

(56) References Cited

U.S. PATENT DOCUMENTS

| | | | |
|---|---|---|---|
| 4,098,728 A | 7/1978 | Rosenblatt | |
| 4,566,911 A | 1/1986 | Tomita et al. | |
| 6,080,092 A | 6/2000 | Cercone et al. | |
| 6,240,588 B1 * | 6/2001 | Dickey et al. | 15/88.3 |
| 6,247,197 B1 * | 6/2001 | Vail et al. | 15/77 |
| 6,328,640 B1 * | 12/2001 | Jones et al. | 451/194 |
| 6,557,202 B1 * | 5/2003 | Bliven et al. | 15/77 |
| 6,684,447 B2 | 2/2004 | Mihara et al. | |
| 6,865,764 B2 * | 3/2005 | Tsai et al. | 15/77 |
| 2004/0151890 A1 | 8/2004 | Drury | |
| 2006/0276108 A1 | 12/2006 | Benson | |

* cited by examiner

*Primary Examiner* — Victor S Chang
(74) *Attorney, Agent, or Firm* — John S. Hale; Gipple & Hale

(57) ABSTRACT

The invention is directed toward a chemical mechanical polishing/planarizing (CMP) brush with an embedded mandrel. PVA foam injected into the substantially hollow mandrel expands through apertures in the mandrel to fill a mold in the desired shape of the brush with the foam in the mandrel being integral with the outer foam covering the brush.

34 Claims, 4 Drawing Sheets

FOAM COMPOSITION ROLLER BRUSH WITH EMBEDDED MANDREL

RELATED APPLICATIONS

This application is a continuation in part of U.S. patent application Ser. No. 10/748,302 to Drury (now published as pre-grant publication no. 2004/0151890) filed on Dec. 31, 2003 now abandoned, which is a continuation of Ser. No. 09/838,138 filed on Apr. 20, 2001 now abandoned.

STATEMENT REGARDING FEDERALLY SPONSORED RESEARCH OR DEVELOPMENT

Not applicable.

REFERENCE TO SEQUENCE LISTING, A TABLE OR A COMPUTER PROGRAM LISTING COMPACT DISC APPENDIX

None.

BACKGROUND OF THE INVENTION

1. Field of Invention

The present invention relates generally to cleaning devices for semiconductor wafers. More specifically, this invention relates to a novel roller constructed of a polyvinyl acetal composition having an embedded mandrel. The roller has no outer skin and a small average pore size allowing chemical flow through the roller body without clogging of the sponge pores thereby prolonging its useful life.

2. Background of the Invention

Many industries today require the ability to efficiently clean highly finished surfaces, removing particles and other surface contaminants. Specific industries having articles with highly finished surfaces include, but are not limited to, wafers of semiconductor material, and memory disks.

The presence of foreign material on semiconductor wafers represents a serious problem in the manufacture of integrated circuits on semiconductor wafers. In the manufacturing process, the surfaces of the wafers are initially polished prior to subsequent processing resulting in the deposition of desired circuits. A combination of chemical and mechanical polishing is generally used requiring the introduction of a polishing slurry onto the surface of the semiconductor wafer as it is being polished or cleaned. The slurry may contain fine abrasive particles and incorporate chemical cleaning compositions such as silica ($SiO_2$) and alumina ($Al_2O_3$). When the polishing is completed the semiconductor wafers must be cleaned to completely remove residual materials to ensure that the surfaces are ready for subsequent photolithographic processing and other manufacturing steps.

Semiconductor wafers must be cleaned prior to any processing steps used to produce semiconductor devices. The pores of currently used chemical mechanical polishing (CMP) roller brushes quickly become clogged with chemicals and waste, reducing flow and prematurely breaking down during the cleaning process.

CMP roller brushes are used to clean the residual cleaning compositions from the surfaces of the semiconductor wafers. These devices for cleaning wafers generally consist of a cylindrical roller passing over a wafer. Alternatively, the rollers are used in tandem, mounted with essentially zero clearance between their cleaning/polishing surfaces. They are then counter-rotated and the wafer is passed between them to effect cleaning, polishing and/or planarization. Conventional CMP roller arrangements can include tufted nylon or other types of bristles extending from a central core and typically include sponge resins of polyvinyl acetal (PVA). The brushes are fixed horizontally and rotate as the wafer or memory disk is passed between the surfaces of the brushes while the surfaces receive large quantities of cleaning solution or de-ionized water.

Wafers cleaned in this manner have a high defect rate due to particles and other surface contaminants missed or passed over in the cleaning process. This results in breakage of the wafers as well as damage to wafer surfaces.

As noted above, more effective cleaning devices using sponge material have become available whereby a foam brush is mechanically affixed to a core or mandrel. This method is used in lieu of the more cumbersome system of mounting the brush or roller onto a core and then mounting the completed unit onto the CMP equipment. Previously known methods of manufacturing these foam brushes include molding the foam directly onto the external diameter of the core or mandrel or pre-mounting the brush onto the core or mandrel. However, the pores of the sponge material quickly become clogged with waste material and the pliability of the sponge material that is necessary for efficacy also makes them particularly prone to surface ripping. It has not been effective to clean such brushes and they are generally discarded after an undesirable amount of residual cleaning composition has been built up in the pores of the brush. Thus, the sponge brushes are generally more effective but require frequent replacement due to the accelerated wear characteristics inherent in their design. However, since such brushes are relatively costly, the dirty brushes are sometimes utilized beyond the point where they should be replaced resulting in inconsistent levels of cleanliness on the wafers lowering the yield of semiconductor product wafers.

3. Description of the Related Art

U.S. Pat. No. 4,098,728 discloses a polyvinyl acetal (PVA) sponge and a method for making the same. In this method, pore spaces in the sponge are formed by gas bubbles; rather than pore forming chemical additives such as starch/sulfate combinations. Because the sponge disclosed in this patent does not have any starch residue, it has been particularly useful in medical applications in which starch residues can cause a foreign body reaction when in contact with human tissue.

The use of synthetic sponges for cleaning devices is well known. For example, U.S. Pat. No. 4,566,911 discloses a roller scrubbing device using a PVA material for cleaning semiconductor chips having a surface layer of elastic PVA material with an average pore diameter ranging from 10 to 200 microns. U.S. Pat. No. 6,080,092 discloses an industrial sponge roller device with a cylindrical body of PVA material and a plurality of projections of a truncated conical shape extending from an outer surface of the cylindrical body.

Conventional synthetic sponges have a polymer structure with "dead end pockets" formed therein that trap residue and trace amounts of metals and have non-uniform pore sizes causing fluid backup and residue deposit. As the sponge wears, these metals can come out of the sponge in the form of particulate matter. Such particulate matter can damage the surfaces that are to be cleaned. Further, this type of sponge has tiny fibrils in the pores thereof that are a result of spaces between the pore forming chemical additive during a cross-linking reaction. "Cross-linking" is the formation of ester bonding between chains of the two adjacent hydroxyl groups that occur with the reaction of polyvinyl alcohol and aldehyde. This reaction hardens and strengthens the resulting material.

These conventional synthetic sponge rollers are generally manufactured by affixing the foam roller material about a more rigid core or mandrel. However, previously known methods of manufacturing CMP brushes results in insufficient adhesion of the foam brush material to the core or mandrel, resulting in slippage and distortion during use. In operation, the foam brush roller is generally rotated at approximately 500 revolutions per minute with the result that irregular deformation of the sponge material occurs due to impingement against the wafer material and centrifugal forces exerted by rotation. Moreover, axial distortion or twisting of the foam brush occurs due to irregular slippage of the roller about the mandrel. The result is an unacceptable degree of irregularity in the planarization, cleaning, and/or polishing of the wafer surface.

SUMMARY OF THE INVENTION

These disadvantages are solved by the present invention in which a substantially hollow mandrel is injected with foam that subsequently flows through fenestrations in the mandrel, thereby forming a foam CMP brush. The foam material inside the mandrel of the brush forms a unitary whole with the foam forming the external portion of the brush. Hence, structural integrity of the brush is increased without any appreciable decrease in the flow properties therein. Inspection of a cross section of the mandrel will indicate that its fenestrations are positioned such that opposing cleaning, polishing, and/or planarizing surfaces of the brush are connected through the central axis of the brush, further increasing structural integrity. The resulting substantially skinless CMP roller of polyvinyl acetal is firmly linked to the mandrel to prevent slippage and distortion, and the usable lifetime of the brush is substantially increased compared to previously known devices. Additionally, the CMP roller has a uniform small pore size throughout the material in which over 90% of the pores of the material range from 7-40 microns in diameter with a mean flow pore diameter of about 20 microns and a mean flow pore pressure of 0.334 PSI, with a dry flow rate through the material ranging from 95.0 L/min to 25.0 L/min and a wet flow of about 80.0 L/min to 6.5 L/min. Due to the skinless open cell structure of the foam, the core is able to take up and pass liquids through the brush closely approximating the flow performance of a hollow core brush.

Accordingly, it is an object of the present invention to provide a new and improved polyvinyl acetal sponge roller for use in cleaning semiconductor wafers which has greater durability than prior sponge rollers.

Another object of the present invention is to provide an improved even flow rate of cleaning solution from the center of the core of the roller to the outside of the diameter of the roller through the sponge material for even application of cleaning solution to the surfaces of the articles being cleaned without clogging.

It is another object of the invention to provide a roller constructed with a material which allows better cleaning of surface materials using less cleaning solution and uniform solvent delivery at low rates.

It is still another object of the present invention is to provide an improved sponge roller for cleaning semiconductors with better strength characteristics.

It is yet another object of the present invention to provide a sponge roller capable of removing ultra-fine particles from hydrophobic surfaces and adding to the life usage of the sponge material used in cleaning the semiconductor wafers.

These and other objects, advantages, and novel features of the present invention will become apparent when considered with the teachings contained in the detailed disclosure along with the accompanying drawings.

DESCRIPTION OF THE INVENTION

Figure 1:
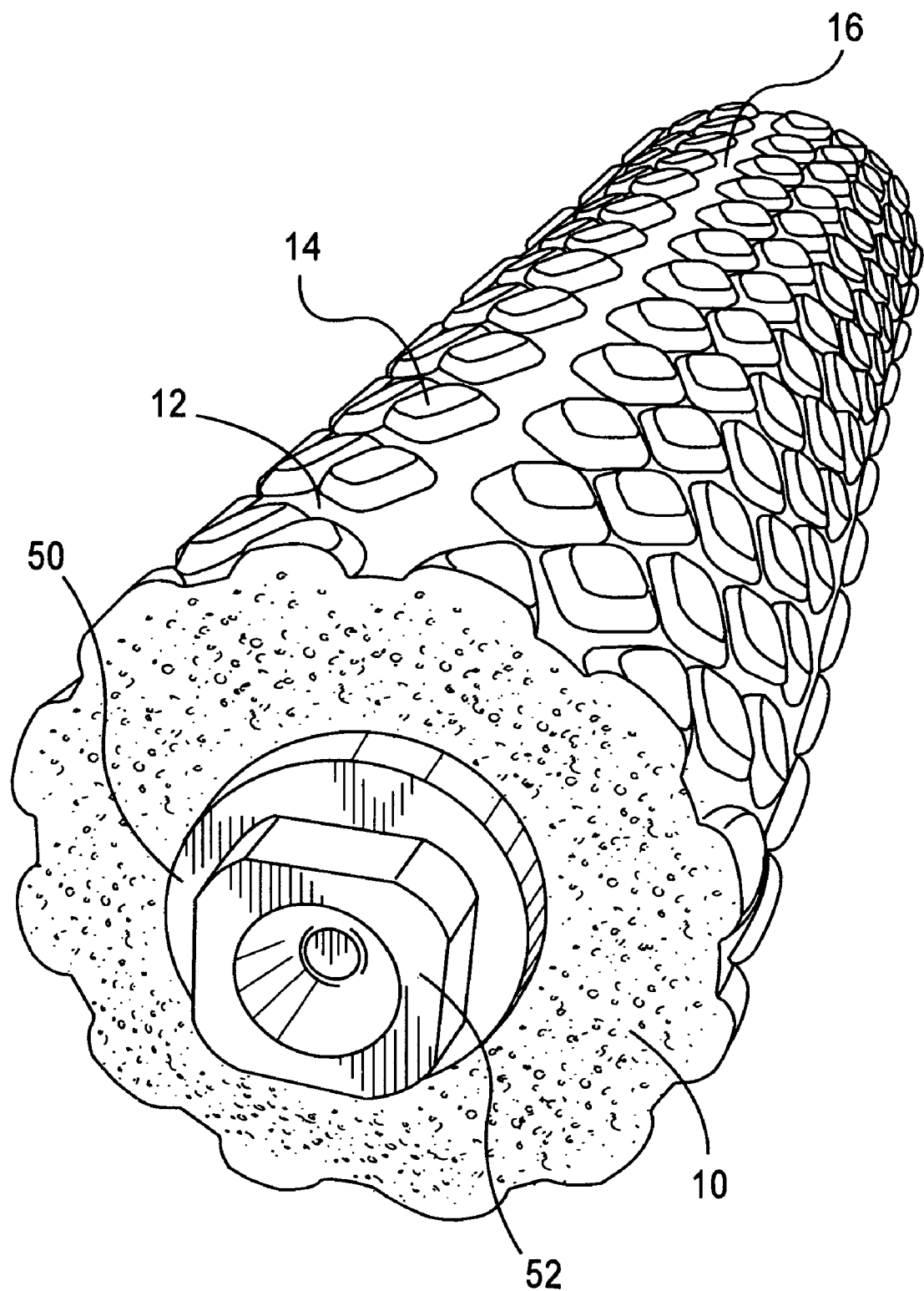
FIG. 1 is a perspective view of the chemical mechanical polishing (CMP) brush.
Figure 2:
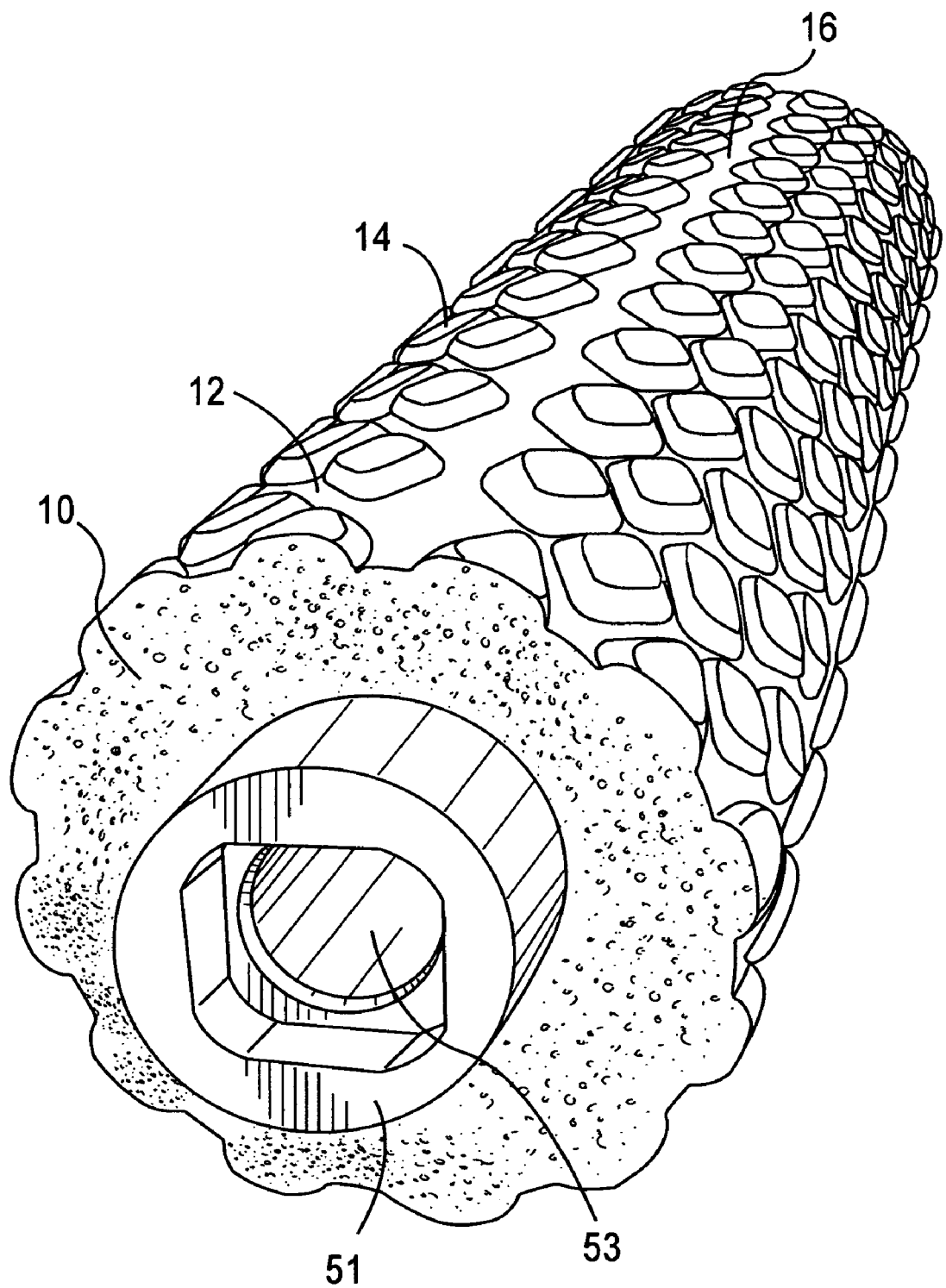
FIG. 2 is a perspective view of the chemical mechanical polishing (CMP) brush shown in FIG. 1 depicting the opposite, female end of its mandrel.

The best mode and the preferred embodiment of the novel semiconductor cleaning device of the present invention is shown generally in FIGS. 1 through 5. These figures are merely an illustration and should not limit the scope of the claims herein. The cleaning device can range in size and shape, depending upon the application. One of ordinary skill in the art would recognize other variations, modifications, and alternatives FIGS. 1 and 2 are perspective views of a preferred embodiment of the CMP roller brush 10 showing opposite ends of the device. FIG. 1 includes a depiction of the mandrel male engaging end 52. FIG. 2 is a reversed complimentary mandrel female engaging element 51. The eccentric shapes of either element 52, 51 facilitate rotation of the brush about its long axis via the CMP roller brush drive mechanism (not shown). Note also the filling aperture 53 of the female engaging element 51 for ingress of PVA foam material during the manufacturing of the CMP brush 10. The filling aperture 53 is also used to provide various cleaning, solvating, and/or polishing admixtures to the brush while in operation.

According to the preferred embodiment, the cleaning device is shaped as a cylindrical roller 10, including a foam outer member 12 and mandrel 50. The foam outer member 12 is substantially skinless and includes homogeneous small pore distribution and sizing throughout. In a preferred embodiment, the surface of the foam outer member 12 includes a plurality of frusto-pyramidal protuberances 14 disposed with the bases of opposing faces generally abutting one another such that a midline traced through abutting protuberances 14 forms a succession of generally helical patterns on the surface 13 of the foam outer member 12. A clearance channel 16 containing no protuberances is positioned longitudinally along the length of the surface of the CMP brush 10.

The foam outer member 12 is constructed of polyvinyl acetal material and has an outer diameter of about 70 mm and an inner diameter of about 30 mm with a thickness of about 20 mm and has a length ranging from 150 mm to 450 mm, preferably 317 mm, and is able to hold tight specifications. The material has a consistent durometer ranging from between 5-9 depending on the wetness of the material and has a uniform small pore size which provides a flow through rate which does not put pressure on the roller or distort it during the cleaning process. This allows even flow of chemicals from the center of the mandrel to the outside of the diameter without sacrificing strength. It is thus easier to pass chemistry through the roller. In combination with the centripetal forces due to rotation of the device, contaminants are flushed out such that the CMP brush 10 is essentially self-cleaning. Average flow requirements are reduced from 500-700 ml/minute to 120-180 ml/minute. The material has a higher rate for a better draw of debris, residue and chemistry from patterned wafer surfaces resulting in a cleaner and dryer end product. The CMP brush 10 can have shapes and sizes to meet the particular cleaning application for devices such as semiconductor wafers, hard disks, and other applications.

The porosity of the PVA material is uniform with at least 90% and preferably about 95% of the pore sizes being below 40 microns with the average pore diameter size or opening being about 20 microns. The pore size diameter opening ranges from about 7 microns to about 40 microns. Thus, the material has good flow properties, enhancing the performance of the CMP roller 10.

The foam outer member 12 has a pore ranging from the smallest detected pore diameter of 7.1912 microns with a smallest detected pore pressure of 0.923 PSI. The foam outer member 10 has a mean flow pore diameter of 20.0 microns with a mean flow pore pressure of 0.334 PSI. The material has a bubble point pressure of 0.026 PSI and maximum pore size distribution of 5.1417 and a diameter at maximum pore size distribution of about 14.34 microns. In measuring the flow rate through the material, at least 90% and preferably 95% of the pores have a diameter of 7 microns through 40 microns with a dry flow ranging from about 95.0 L/min to about 25.0 L/min and a wet flow of about 80.0 L/min to 6.5 L/min. The aforenoted measurements were determined using a standard capillary flow analysis. The flow was measured under the Darcy method of measuring flow using water as the fluid, with a fluid viscosity of 1.000 CP with an average Darcy Permeability Constant of 5.1849.

In the present embodiment, the roller devices 10 are made using a suitable material that is firm, porous, elastic, and has certain abrasion resistiveness. The primary raw starting material for the device is air blown polyvinyl alcohol which is used to form a polyvinyl acetal porous elastic material with a uniform cell structure. The porous material varies in characteristic depending upon cleanliness, type of pore forming agent or process, type of aldehyde employed for the conversion of a polyvinyl alcohol to a polyvinyl acetal, and other factors. These factors also include the relative proportions of reactants, reaction temperature and time, and the general condition and starting materials in the manufacturing process.

Figure 3:
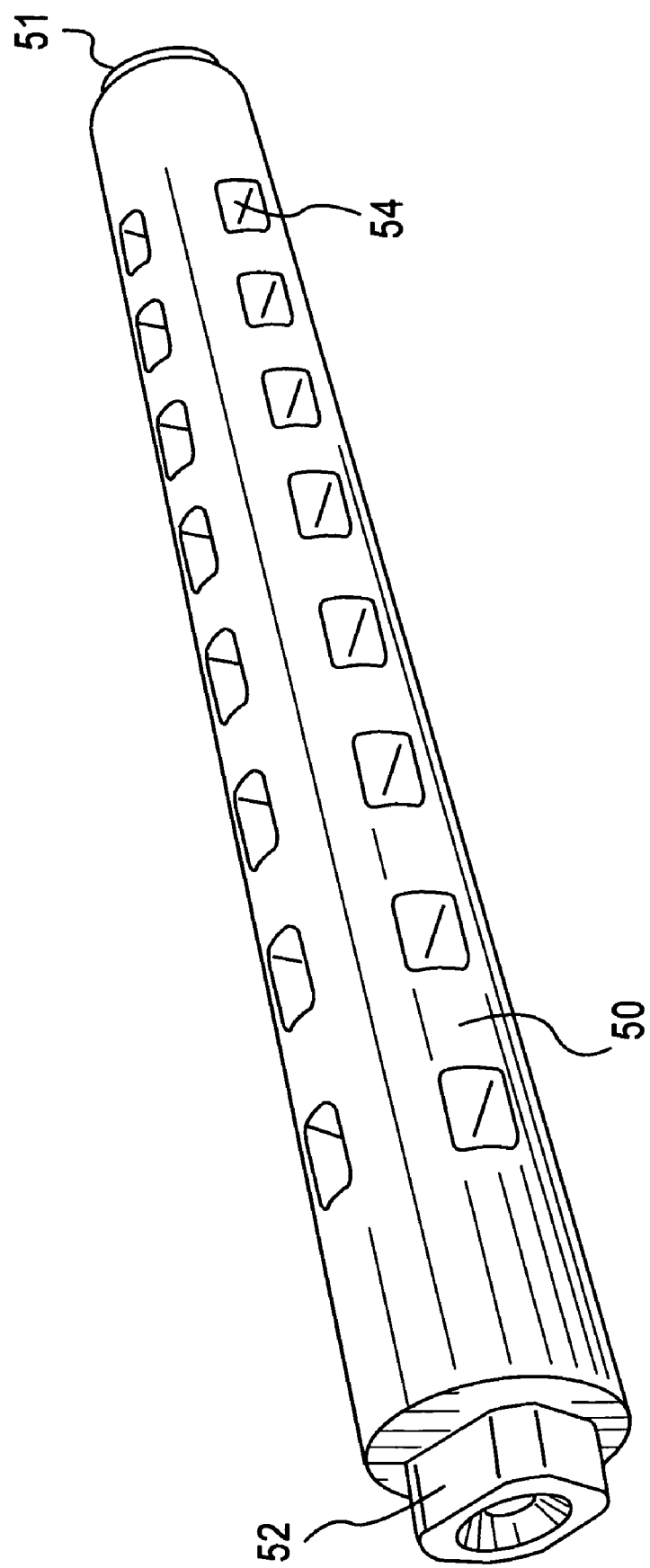
FIG. 3 is a perspective view of the mandrel of the chemical mechanical polishing (CMP) brush with the foam outer member removed.
Figure 4:
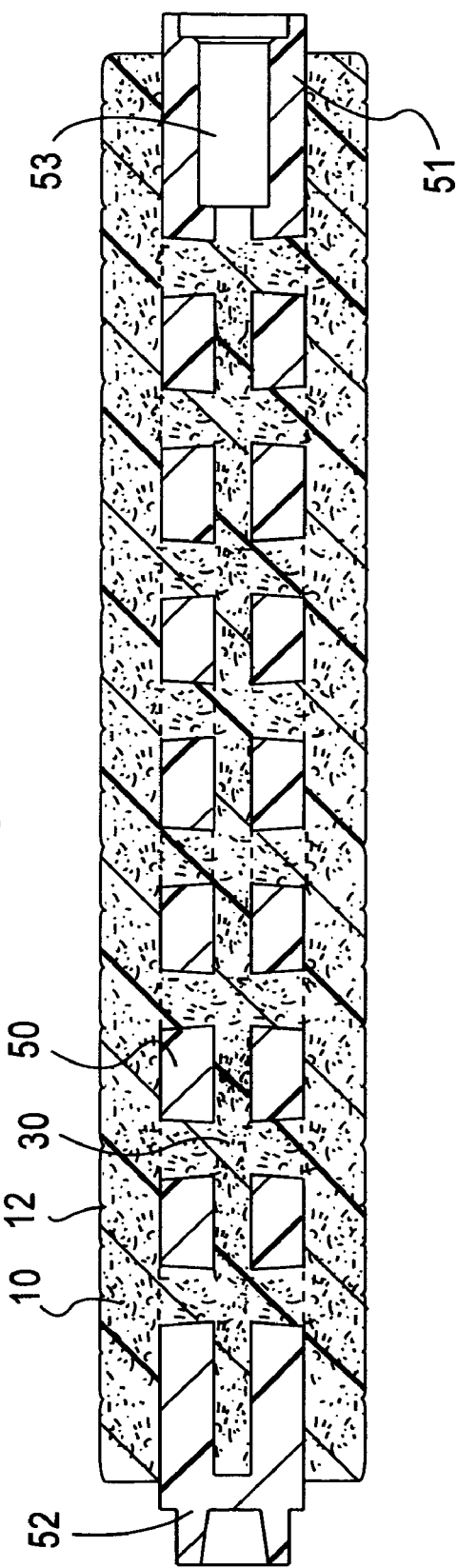
FIG. 4 is a cross section view of the chemical mechanical polishing (CMP) brush along a lengthwise plane bisecting adjacent, lengthwise apertures in the mandrel.
Figure 5:
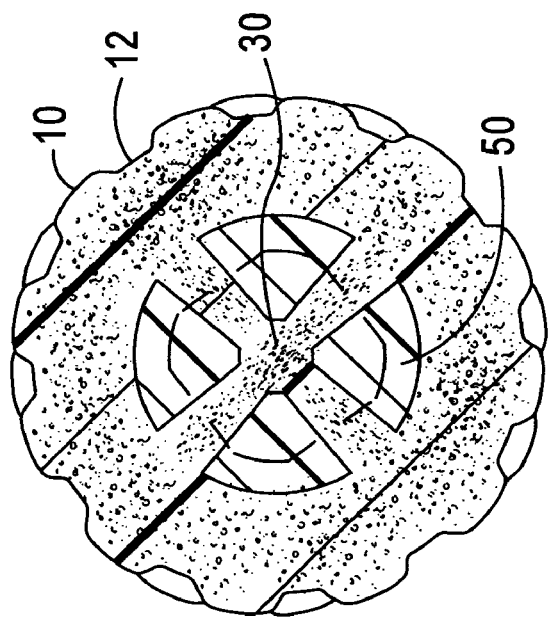
FIG. 5 is a cross section view of the chemical mechanical polishing (CMP) brush across its diameter, bisecting circumferential apertures in the mandrel.

Turning now to FIGS. 3, 4, and 5, in manufacture, the mandrel 50 is placed into a mold having the generally desired shape of the final product and injected through its filling aperture 53 with the polyvinyl acetal (PVA) material described above. The PVA expands through the apertures 54 in the mandrel 50 to fill the mold cavity. Prior to injection, the PVA material is heated and solubilized at about 190 degrees Fahrenheit, mixed with cross linking agent and catalyzed. After injection, the now formed CMP brush 10 is slowly cured before removal from the mold. After removing the molded polyvinyl acetal material from the cast, the shaped material is washed with a di-water carrier several times to remove the forming formaldehyde so that the formaldehyde is undetectable by high pressure liquid chromatography but believed to be less than 0.1 part per million. It is thereafter saturated in a 1%-5%, preferably 1.5%, $H_2O_2$ solution to inhibit microbial formation during storage. Packaged in this manner, the CMP roller brush has a shelf life of at least three years.

The number, size, and positioning of the apertures 54 in the mandrel 50 promote the structural integrity of the CMP roller brush 10. Increasing the size and/or number of apertures 54 promotes better flow characteristics through the foam outer member 12 but tends to reduce rigidity of the mandrel 50, and therefore the rotational integrity of CMP brush 10 in toto. The result is a lack of uniformity during cleaning, polishing, and/or planarization. Conversely, decreasing the size and/or number of apertures 54 will tend to promote rotational integrity but at the expense of fluid flow through the brush 10, thereby reducing its useful lifetime.

The percentage area of contact necessary to stabilize and connect the outer foam member 12 to the inner foam core 30 varies by the amount of foam comprising the outer diameter of the CMP brush 10. Comparatively large volumes of foam comprising the foam outer member 12 require comparatively greater percentages of connection to the inner foam core 30.

To ensure that the foam outer member 12 remains affixed to mandrel 50, greater than 2% of the surface area of the mandrel must be fenestrated or apertured to allow for the foam comprising the outer foam member 12 to adequately interconnect with the inner foam core 30. Approximately 20% to 25% fenestration of the mandrel 50 is ideal in order to adequately interconnect the inner foam core 30 and outer foam member 12 while maximizing fluid flow through the CMP brush 10. In a preferred embodiment of a CMP roller brush 10 with an overall outside diameter of 70 mm, length of 317 mm, and a mandrel with 30 mm outside diameter, 21.6% of the mandrel surface was fenestrated (i.e., approximately 7,296 $mm^2$ surface area of the fenestrations versus approximately 33,755 $mm^2$ surface area of the mandrel). This allows the structural integrity of the mandrel to remain intact while allowing sufficient flow through of the foam to properly affix the foam to the mandrel. Less than 2% fenestration does not provide sufficient contact, permitting the foam outer member 12 to rotate and distort on the mandrel 50. Depending on the type of material used for the mandrel, the contact area permissible for flow through can be as great as 80%. Greater than 80% fenestration of the mandrel permits a degree of flexibility in the mandrel that renders it useless.

In another preferred embodiment with an overall outside diameter of 38 mm, the degree of fenestration required to adequately affix the foam outer member 12 to the mandrel is 12.7% due to the reduced volume of the foam outer member 12. In this embodiment, the surface area of the mandrel is 20,441 $mm^2$ and the degree of fenestration necessary to affix the foam outer member 12 while maintaining the integrity of the mandrel 50 and ensuring adequate flow characteristics in the entire CMP brush unit 10 is 2,507 $mm^2$.

The principles, preferred embodiments and modes of operation of the present invention have been described in the foregoing specification. However, the invention should not be construed as limited to the particular embodiments which have been described above. Instead, the embodiments described here should be regarded as illustrative rather than restrictive. Variations and changes may be made by others without departing from the scope of the present invention as defined by the following claims:

What is claimed is:
1. A unitary chemical mechanical polishing (CMP) brush comprising:
    a substantially cylindrical mandrel defining an internal cavity therein;
    a plurality of spaced apertures in said mandrel leading to said internal cavity;

a foam material disposed within said cavity to form a foam core and extending outside said cavity to form a foam outer member; and, said foam outer member being disposed on the exterior surface of said mandrel and integrally connected to said foam core through said apertures.

2. A unitary chemical mechanical polishing (CMP) brush as claimed in claim 1 wherein said foam core and said foam outer member are starch free polyvinyl acetal.

3. A unitary chemical mechanical polishing (CMP) brush as claimed in claim 1 wherein said foam core and said foam outer member are a porous polyvinyl acetal material with over 90% of its pores ranging in size from about 7 μm to about 40 μm in diameter.

4. A unitary chemical mechanical polishing (CMP) brush as claimed in claim 1 wherein said foam core and said foam outer member are a porous polyvinyl acetal material with an average pore size of about 20 μm.

5. A unitary chemical mechanical polishing (CMP) brush as claimed in claim 1 wherein said foam core and said foam outer member are a porous polyvinyl acetal material with about 95% of its pores having a diameter below 40 μm.

6. A unitary chemical mechanical polishing (CMP) brush as claimed in claim 1 wherein said foam core and said foam outer member are a porous polyvinyl acetal material with a bubble point pressure about 0.92 psi.

7. A unitary chemical mechanical polishing (CMP) brush as claimed in claim 1 wherein said foam core and said foam outer member are a porous polyvinyl acetal material with a mean flow pressure of about 0.33 psi.

8. A unitary chemical mechanical polishing (CMP) brush as claimed in claim 1 wherein said brush has an outside diameter between about 38 mm to about 90 mm and an overall length between about 275 mm to about 345 mm.

9. A unitary chemical mechanical polishing (CMP) brush as claimed in claim 1 wherein said brush has an outside diameter of about 70 mm and an overall length of about 317 mm.

10. A unitary chemical mechanical polishing (CMP) brush as claimed in claim 1 wherein said apertures in said mandrel range from about 2% to about 80% of the surface area of said mandrel.

11. A unitary chemical mechanical polishing (CMP) brush as claimed in claim 1 wherein said apertures in said mandrel range from about 20% to about 25% of the surface area of said mandrel.

12. A unitary chemical mechanical polishing (CMP) brush as claimed in claim 1 wherein said apertures in said mandrel range from about 10% to about 15% of the surface area of said mandrel.

13. A unitary chemical mechanical polishing (CMP) brush as claimed in claim 1 wherein said apertures in said mandrel are diametrically positioned across a longitudinal centerline of said mandrel.

14. A unitary chemical mechanical polishing (CMP) brush as claimed in claim 1 wherein said brush is saturated with hydrogen peroxide (H2O2) in a range of about 1% to about 5%.

15. A unitary chemical mechanical polishing (CMP) brush as claimed in claim 1 wherein said brush is saturated with an antimicrobial agent.

16. A unitary chemical mechanical polishing (CMP) brush as claimed in claim 1 wherein said foam outer member includes a substantially smooth exterior surface with clearance channels formed therein.

17. A unitary chemical mechanical polishing (CMP) brush as claimed in claim 1 wherein said foam outer member includes a plurality of protuberances on its exterior surface.

18. A unitary chemical mechanical polishing (CMP) brush as claimed in claim 17 wherein said protuberances are substantially frusto-pyramidal protuberances disposed on the exterior surface of said foam outer member with one base of the face of any said protuberance generally abutting one base of the face of an adjacent protuberance, said plurality of protuberances generally forming helical patterns on the exterior surface of said foam outer member.

19. A unitary chemical mechanical polishing (CMP) brush comprising:

a substantially cylindrical mandrel defining a cylindrically shaped cavity therein;

a plurality of radial apertures in said mandrel communicating with said cavity; and, a porous polyvinyl acetal foam core disposed within said cavity extending through said apertures forming a porous polyvinyl acetal foam outer member disposed on the exterior surface of said mandrel.

20. A unitary chemical mechanical polishing (CMP) brush as claimed in claim 19 wherein said foam outer member is contiguous with and integral with said foam core through said apertures.

21. A unitary chemical mechanical polishing (CMP) brush as claimed in claim 1 wherein said mandrel includes at least one engaging element facilitating rotatable engagement with a shaft.

22. A unitary chemical mechanical polishing (CMP) brush as claimed in claim 1 wherein said apertures in said mandrel are about 12% of the surface area of said mandrel.

23. A unitary chemical mechanical polishing (CMP) brush as claimed in claim 19 wherein said brush has an outside diameter of about 70 mm and an overall length of about 317 mm.

24. A unitary chemical mechanical polishing (CMP) brush as claimed in claim 19 wherein said porous polyvinyl acetal foam outer member includes a plurality of protuberances on its exterior surface.

25. A unitary chemical mechanical polishing (CMP) brush as claimed in claim 24 wherein said plurality of protuberances generally form helical patterns on the exterior surface of said porous polyvinyl acetal foam outer member.

26. A chemical mechanical polishing (CMP) brush comprising:

a substantially cylindrical mandrel defining an internal cavity therein;

a plurality of through going apertures defined in said mandrel leading to said internal cavity;

a polyvinyl acetal foam material disposed within said internal cavity forming a foam core in said cavity and extending through said apertures defined by said mandrel to form a foam outer section; and, said foam outer section being disposed on the exterior surface of said mandrel and forming a cylindrical base with a plurality of protuberances extending upward from said cylindrical base.

27. A chemical mechanical polishing (CMP) brush as claimed in claim 26 wherein said foam core and said foam outer member are starch free polyvinyl acetal.

28. A chemical mechanical polishing (CMP) brush as claimed in claim 26 wherein said foam core and said foam outer member are a porous polyvinyl acetal material with over 90% of its pores ranging in size from about 7 μm to about 40 μm in diameter.

29. A chemical mechanical polishing (CMP) brush as claimed in claim 26 wherein said foam core and said foam outer member are a porous polyvinyl acetal material with a bubble point pressure about 0.92 psi.

30. A chemical mechanical polishing (CMP) brush as claimed in claim 26 wherein said foam core and said foam outer member have a wet flow ranging from about 6.5 L/min to about 80.0 L/min.

31. A chemical mechanical polishing (CMP) brush as claimed in claim 26 wherein said mandrel is provided with through going apertures ranging from about 20% to about 25% of said mandrel surface area.

32. A chemical mechanical polishing (CMP) brush as claimed in claim 26 wherein said mandrel is provided with through going apertures ranging from greater than 2% to less than 80% of said mandrel surface area.

33. A chemical mechanical polishing (CMP) brush comprising:
- a substantially cylindrical mandrel defining an internal cavity therein;
- a plurality of through going apertures defined in said mandrel leading to said internal cavity;
- said apertures in said mandrel ranging from about 20% to about 25% of the surface area of said mandrel;
- a polyvinyl acetal foam material disposed within said internal cavity forming a foam core in said cavity and extending through said apertures defined by said mandrel to form a foam outer section;
- said foam core and said foam outer member being formed of a porous polyvinyl acetal material with over 90% of its pores ranging in size from about 7 µm to about 40 µm in diameter; and
- said foam outer section being disposed on the exterior surface of said mandrel and forming a cylindrical base with a plurality of protuberances in linear configurations extending upward from said cylindrical base.

34. A unitary chemical mechanical polishing (CMP) brush as claimed in claim 24 wherein said plurality of protuberances are configured in a plurality of linear orientations.

* * * * *